United States Patent [19]

Shahar et al.

[11] Patent Number: 4,938,841

[45] Date of Patent: Jul. 3, 1990

[54] TWO-LEVEL LITHOGRAPHIC MASK FOR PRODUCING TAPERED DEPTH

[75] Inventors: Arie Shahar, Aberdeen; Walter J. Tomlinson, III, Holmdel, both of N.J.

[73] Assignee: Bell Communications Research, Inc., Livingston, N.J.

[21] Appl. No.: 429,560

[22] Filed: Oct. 31, 1989

[51] Int. Cl.$^5$ ............... H01L 21/306; B44C 1/22; C03C 15/00; C03C 25/06

[52] U.S. Cl. ................. 156/661.1; 156/644; 156/651; 156/653; 156/655; 156/657; 156/662; 252/79.2; 252/79.3; 430/313

[58] Field of Search ............... 156/644, 651, 653, 655, 156/657, 659.1, 661.1, 662; 252/79.2, 79.3; 430/312, 313, 317; 427/43.1; 437/229, 234, 235; 372/50; 350/96.12

[56] References Cited

U.S. PATENT DOCUMENTS

| | | | |
|---|---|---|---|
| 4,092,210 | 5/1978 | Hoepfner | 156/643 |
| 4,461,672 | 7/1984 | Musser | 156/651 X |
| 4,484,978 | 11/1984 | Keyser | 156/643 |
| 4,595,454 | 6/1986 | Dautremont-Smith | 156/647 |
| 4,635,090 | 1/1987 | Tamaki et al. | 357/50 |
| 4,758,305 | 7/1988 | Bonifield et al. | 156/643 |

*Primary Examiner*—William A. Powell
*Attorney, Agent, or Firm*—James W. Falk; Charles S. Guenzer

[57] ABSTRACT

A method of producing a sloped surface in a semiconductor material. In the area where the slope is desired a dynamic mask is applied to the surface of the semiconductor. A standard mask is applied over the dynamic mask and patterned so that its edge laterally defines the bottom of the desired slope. The sample is then immersed in an etchant that etches the dynamic mask faster than the semiconductor material. The standard mask is not appreciably etched. The dynamic mask is progressively etched laterally, thereby dynamically exposing more of the semiconductor material to etchant and producing a sloped surface therein.

15 Claims, 4 Drawing Sheets

TWO-LEVEL LITHOGRAPHIC MASK FOR PRODUCING TAPERED DEPTH

FIELD OF THE INVENTION

The invention relates generally to lithographically defined etching. In particular, the invention relates to a mask and an etching technique producing an etched area having a gradually varying depth.

BACKGROUND OF THE INVENTION

Lithographically defined etching provides the means to delineate the features on electronic and opto-electronic integrated circuits. Briefly summarized, in this method a resist, usually a photo-sensitive resist (photoresist), is uniformly spread on a semiconductor substrate, which may or may not have previously defined horizontal features or vertical structure. The photoresist is exposed to an optical pattern, developed and removed in the exposed area (in the case of positive resist). Electron beam writing of the photoresist is equivalent. Thereafter, the patterned substrate is exposed to an etching agent. The agent may be an ion beam, a plasma, or, more commonly, a liquid etchant that etches the substrate but not the developed photoresist. Thereby, the exposed area of the substrate is etched but the substrate covered by the patterned resist is not. The patterned developed resist is thus known as a mask. Masks may be formed by other means, such as a metal masked formed by depositing metal over a resist-patterned substrate and then lifting off the resist and the overlying metal.

Conceptually, most etching is assumed to produce nearly vertical sidewalls in the etched holes, the position of the sidewalls being determined by the edge of the mask. Most liquid etchants, in fact, etch the substrate not only in the vertical direction beneath the mask hole, but also to some extent etch horizontally beneath the mask so as to undercut it. The result is a tapered etch, that is, the sidewall is sloped or inclined at a significant angle from the vertical. Some slope is often desirable, such as when a metal interconnect is deposited over the etched substrate in the area of the etched hole. Too sharp a discontinuity in the surface may interrupt the interconnect. This effect is called the coverage problem.

There are several techniques to reliably provide a sloped sidewall. One technique, such as that disclosed by Keyser in U.S. Pat. No. 4,484,978, uses a cantilevered or undercut mask. Two levels of mask material are sequentially deposited over the substrate. The upper level is patterned so as to expose the lower level. A etchant is then applied which etches away not only the exposed lower level mask but also a side portion of the lower level mask underlying the upper level mask. That is, the upper level mask is cantilevered over the substrate with a free space, equal in thickness to the lower level mask, extending away from the originally patterned hole for a distance of 0.1 to 1.0 $\mu$m. Thereafter, another etchant is used that etches neither mask level material but which does etch the substrate. (Keyser in fact additionally used an intermediate anisotropic ion beam etch to form a vertical wall trench defined by the cantilever mask, but this step is not material to the present invention.) Because of the diffusion limited etching in the undercut area, the substrate underlying the undercut area is only partially etched relative to the fully exposed hole. The effect is a gradually sloping sidewall generally underlying the undercut area. The slope of the sidewall is not usually defined but appears to be sufficient to overcome the coverage problem. Photomicrographs disclosed by Bonifield et al in U.S. Pat. No. 4,758,305 for a related technique show a minimum consistent slope of about 45° from the horizontal.

Hoepfner et al discloses another two-level mask technique in U.S. Pat. No. 4,092,210. A two-level mask is deposited on an $SiO_2$ substrate and an aperture is formed extending through both levels to the substrate. Ion etching is performed on the structure. The ions have a very high disintegration or etching rate for the substrate, a moderate rate for the lower level mask and a lower rate for the upper level mask. As long as the upper level mask remains, the substrate is etched vertically. Once the upper level mask has disintegrated, the lower level mask begins to disintegrate beginning at the aperture. Thereby, sloping sidewalls are formed in the $SiO_2$ substrate. The disclosure is directed to the coverage problem of subsequent layers.

Tamaki et al discloses in U.S. Pat. No. 4,635,090 a two-level mask technique somewhat related to that of Keyser. After formation of the cantilever mask, an anisotropic KOH etch is used. The orientations are such that the KOH forms 55° sidewalls, the upper ends of which are pinned at the interiors of the undercuts. Thereafter, the cantilever mask can be used for vertical ion beam etching. Dautremont-Smith et al disclose a variant of this process in U.S. Pat. No. 4,595,454. They first grew a native oxide to a thickness of 2 nm on InP and thereafter lithographically defined an upper mask layer. Thereafter an etchant was used in which the native oxide was soluble and which anisotropically etched the underlying InP to form a V-groove. They controlled the amount of undercutting by changes in the solubility or the thickness of the native oxide in order to achieve a completely V-shaped groove. This disclosed method is however limited by the poor native oxides in III-V compounds and the fixed anisotropic etching angles, usually 55°.

Optical integrated circuits have put new demands on smoothly varying features. Light is guided on such integrated circuits by waveguide structures. Preferably the waveguide will be single-mode and will not have a discontinuity of sufficient size to cause unwanted reflection or radiation because of mode mismatching. However, if the waveguide must transition from one depth in the substrate to another, a gentle slope is required to achieve the above preferred qualities. The 45° or 55° sidewalls achievable in the prior art are not adequately gentle. This requirement is sometimes referred to as an adiabatic transition.

The precise length of the taper necessary to achieve an adiabatic transition depends on the detailed structure of the waveguides and can be difficult to calculate; however, a simple analysis provides an estimate of the order of magnitude of taper length required. To avoid significant coupling to radiation modes, one wants the taper length to be many times the beat length between the guided mode and the radiation modes, with the strongest coupling to the guided mode. See, for example the explanation by A.W. Snyder et al in Chapter 19, entitled "Slowly varying waveguides" appearing in the book *Optical Waveguide Theory*, (Chapman and Hall, New York, 1983). That beat length is given by $\lambda/(N_g - N_r)$, where $\lambda$ is the free-space wavelength of the light, $N_g$ is effective refractive index of the guided mode, and $N_r$ is the effective refractive index of the radiation mode. If it is assumed, for example, that $N_g$ is approximately equal to the index of the light bearing GaAs (3.373), and that $N_r$ is approximately equal to the index of the neighboring $Ga_{0.9}Al_{0.1}As$ (3.327), the required taper length can be estimated to be longer than 22·$\lambda$. For an etch depth of ~$\lambda$, corresponding to a single-mode waveguide, this limit corresponds to a slope angle of 2.6°. Therefore, it is recommended that slope angles not exceed ~1° (taper length 57 times the etch depth). Slope angles of less than ~0.01° (taper length 5720 times the etch depth) become impractical for many opto-electronic applications because the slope extends over a large fraction of the chip.

Chang-Hasnain et al have disclosed in commonly assigned U.S. Pat. application, Ser. No. 07/341,634, filed Apr. 21, 1989, U.S. Pat. No. 4,922,508, such a transition for a semiconductor laser formed near the bottom of a V-shaped groove. In order to couple this light to a layer near the top of the groove but exterior thereto, the output end of the groove was gently tapered to a tip in the horizontal plane. The anisotropic etching forming the V-shaped groove produced smaller but proportional cross-sections of the V-shaped groove nearer the tip. This technique is, however, useful only when the V-shaped grooves are an integral part of the device.

Other techniques have been proposed to provide adiabatic transitions. Shadowing from an elevated mask or mechanically moving a mask during deposition provides a gentle slope. Thermal broadening of a diffused waveguide or thermally dependent growth conditions can produce tapering if there is a temperature gradient. However, these techniques are not amenable to complex integrated circuits. Waveguides grown by flame hydrolysis with a moving gas jet may have their thickness varied by synchronizing the jet movement with the changes in the gas composition. However, these techniques are not amenable to complex integrated circuits. It has been suggested that for waveguides of width less than a diffusion length in LPE, the mass of deposited material is independent of the width. Therefore, narrower waveguides will be thicker than wider ones. The transition will be continuously tapered. This technique has limited applicability.

SUMMARY OF THE INVENTION

Accordingly, it is an object of the invention to provide a method of forming a gentle slope in the surface of a semiconductor or other material.

It is a further object to provide such a slope of controllable inclination.

It is yet a further object of the invention to provide for waveguiding structures having adiabatic transitions.

It is another object of the invention to provide such a method compatible with semiconductor processing.

The invention can be summarized as a method of forming a gradually tapered groove in a controllable fashion. A two-level mask is applied to the surface of the substrate to be etched and includes a standard upper mask and a dynamic mask at least partially underlying the standard mask. The standard mask is patterned for the groove. The structure is then etched with an etching solution having a higher etching rate for the dynamic mask than for the substrate. The standard mask is resistant to the etch. Thereby, the dynamic mask is gradually etched away in the lateral direction, dynamically exposing more of the substrate to etching. Thus, a taper is formed in the substrate.

BRIEF DESCRIPTION OF THE DRAWING

FIGS. 4 and 7 are taken along cross-sectional line IV—IV of FIG. 3; FIGS. 5 and 8 are taken along cross-sectional line V—V of FIG. 3; and FIG. 6 is taken along cross-sectional line VI—VI of FIG. 3.

DETAILED DESCRIPTION

Figure 1:
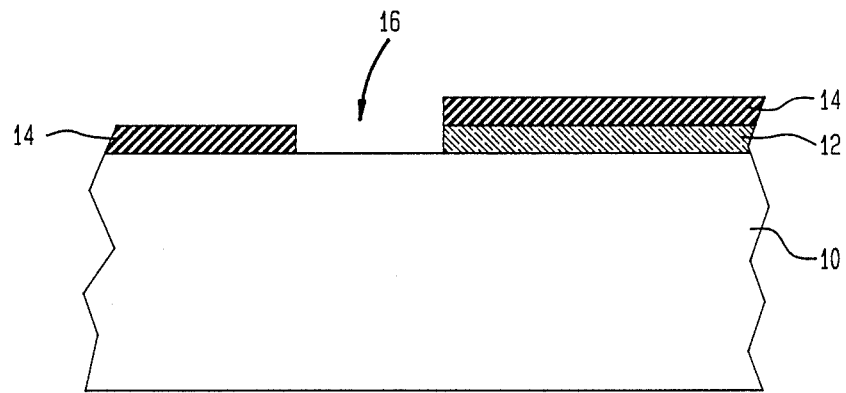
FIG. 1 is a cross-section of two-level mask prior to etching in a configuration useful for explaining the invention.

As illustrated in FIG. 1, a substrate 10 to be etched with a tapered surface has formed thereon a two-level mask. A lower level mask 12 is deposited adjacent the surface of the substrate 10. Over the dynamic mask 12 is deposited a standard mask 14. An aperture 16 is formed in the standard mask 14 to define the central part of the groove to be formed. If a standard sidewall rather than a tapered sidewall is desired, the dynamic mask 12 is omitted beneath the standard mask 14, as is illustrated on the left.

The material for the dynamic mask 12 is chosen relative to the substrate 10 and the etchant such that the etching rate $r_d$ for the dynamic mask 12 with that etchant is greater than the etching rate $r_s$ for the substrate. The etching rate for the standard mask 14 must be less than either of these values and is assumed to be negligible. After the formation of the standard mask aperture 16, the specimen is etched with the required etchant which produces a groove 18 illustrated in FIG. 2. Since the dynamic mask 12 is etched faster than the substrate, an undercut is formed between the standard mask 14 and the substrate 10. Thereby, the substrate 10 is protected by a mask which gradually dissolves and has a dynamically increasing aperture. A tapered sidewall 20 is thus produced. The taper length l is approximately equal to the standard etched depth d times the ratio of the etch rates $r_d/r_s$. The inclination angle $\theta$ from the horizontal of the tapered sidewall is then given by $$\tan\theta = r_s/r_d.$$

In the case that the etching is not isotropic, $r_s$ would be the vertical etching rate of the substrate and $r_d$ would be the horizontal etching rate of the dynamic mask. The taper can made more gentle ($\theta$ decreased) by increasing the dynamic mask etching rate relative to that of the substrate. In contrast, when no dynamic mask is used, as illustrated on the left of FIG. 2, there may be some undercutting but a resulting sidewall 22 is much steeper. The steep sidewall 22 would result if the etching rate for the dynamic mask 12 were equal to or less than that for the substrate 10. Only when the etching rate for the dynamic mask 12 exceeds that for the substrate 10 does the sidewall become more gentle.

Two etchants may be chosen which respectively etch only (or preferentially) the dynamic mask or only the substrate. Then, by a controlled variation of a mixture of these two etchants in a single solution, the inclination angle $\theta$ can be easily controlled. For the previously-mentioned slope of 2.6°, the etch rate ratio $r_d/r_s$ would be 22; for 1°, 57; and for 0.1°, 572. One example relies on $HCl:H_2O_2:H_2O$ (80:4:1 by volume) being an effective isotropic diffusion-limited etchant for GaAs and AlGaAs while InP is very rapidly etched by HCl. InP would thus provide an effective dynamic mask for GaAs/AlGaAs waveguides with the taper controlled by varying the HCl concentration. A second example relies on a $SiO_2$ dynamic mask being etched by buffered HF so that a controlled ratio of buffered HF and a GaAs/AlGaAs etchant could control the taper.

The taper angle $\theta$ can additionally be controlled by the thickness of the dynamic mask layer and the adhesion of the standard mask to the dynamic mask.

Figure 2:
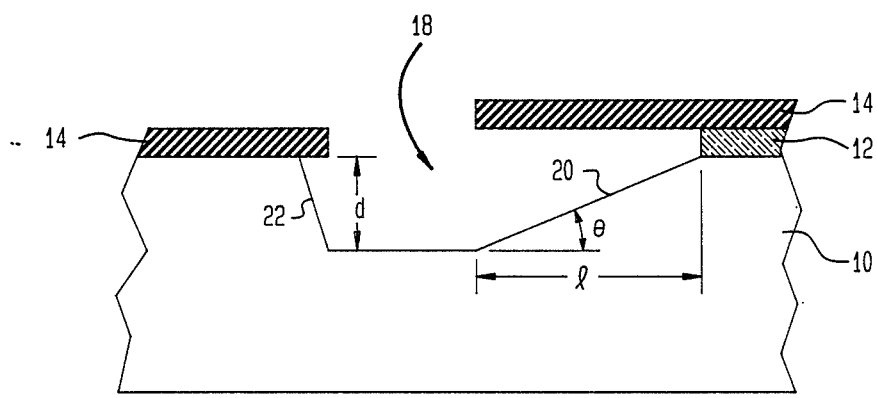
FIG. 2 is a cross-section of the two-level mask and tapered groove corresponding to FIG. 1 but following differential etching.

The cross-sections of FIGS. 1 and 2 have assumed precise alignment between the standard and dynamic masks 12 and 14 on the left. However, since the dynamic mask 12 is quickly etched, it can extend a substantial distance into the aperture 16 and perhaps extend a slight distance below the left-side standard mask 14. If a similar slope is desired on both sides, the underlying dynamic mask 12 does not need to be patterned at all.

Figure 3:
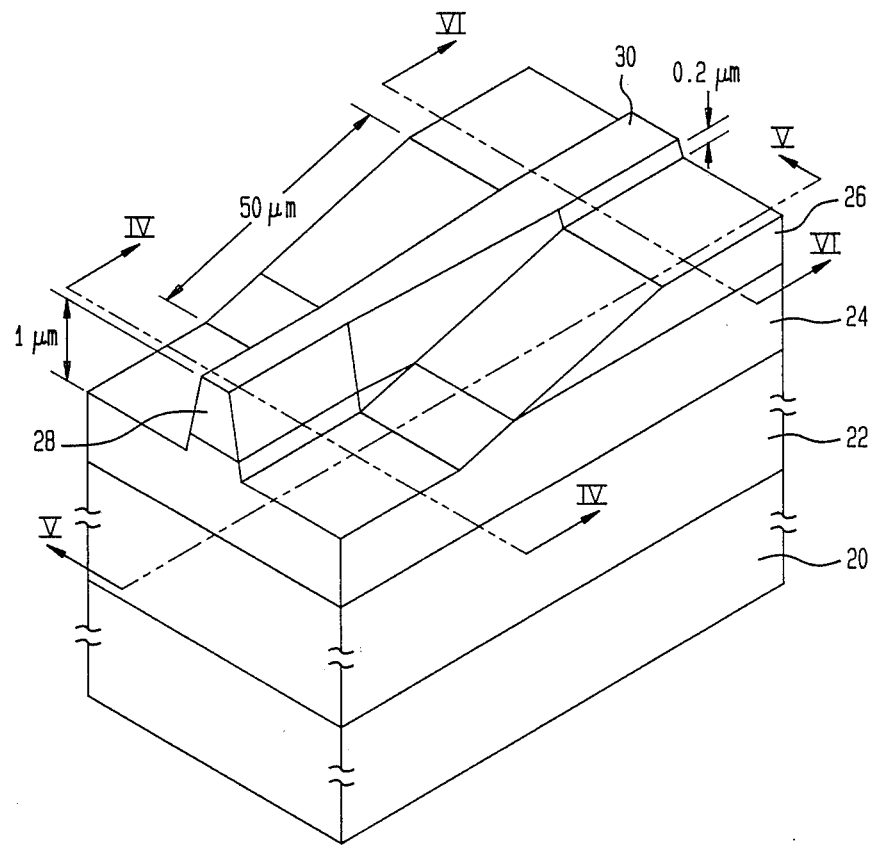
FIG. 3 is a perspective view of a tapered rib waveguide fabricated according to the invention.

An example of a tapered rib waveguide structure which can be easily fabricated with the present invention is illustrated in perspective in FIG. 3. A GaAs/GaAlAs double-heterostructure was epitaxially grown by organo-metallic chemical vapor deposition (OMCVD). The unetched structure comprised: (1) an (001)-oriented $n^+$GaAs wafer 20 on which the epitaxial growth was performed, (2) a 6 $\mu$m thick $Ga_{0.9}Al_{0.1}As$ buffer or lower cladding layer 22 with $n \approx 10^{14}$ cm$^{-3}$, (3) a 0.75 $\mu$m thick GaAs guiding layer 24, having a residual n-type residual carrier concentration of $5 \times 10^{15}$ cm$^{-3}$, and (4) a 0.7 $\mu$m thick $Ga_{0.9}Al_{0.1}As$ upper cladding layer 26 with the same doping as the lower cladding layer 22.

By the following process a rib waveguide was formed which tapered from a high rib 28 of 1 $\mu$m in height and 2.5 $\mu$m in width to a low rib 30 of 0.2 $\mu$m in height and 3.5 $\mu$m in width over a taper distance of 50 $\mu$m.

Figure 4:
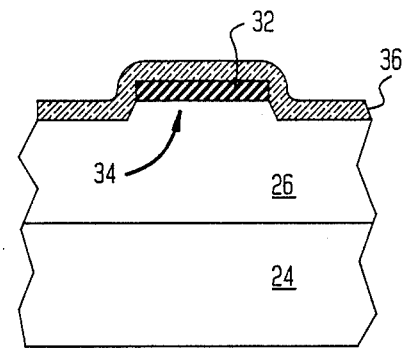
FIGS. 4 through 8 are cross-sectional views of the rib waveguide structure of FIG. 3 at points during the fabrication process.
Figure 5:
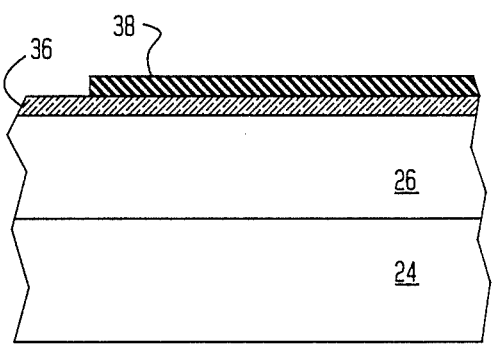
Figure 6:
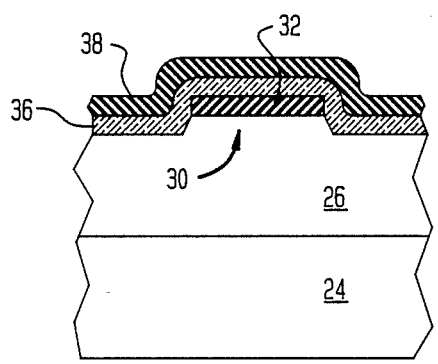

As illustrated in the cross-sections of FIGS. 4, 5 and 6, an AZ-5214 photoresist mask 32 having a uniform width of 3.5 $\mu$m was photographically formed to define the rib. AZ resists are available from Hoechst-Celanese of Somerville, N.J. The cladding layer 26 was shallow etched to a depth of 0.2 $\mu$m using a solution of $SBW:HBr:H_2O$ (1:1:2 by volume), where SBW is a saturated bromine water solution, to form the low rib 30 and an upper part 34 of the high rib 28. This upper part 34 had a width greater then that eventually obtained for the high rib 28. With the rib mask 32 remaining in place, a dynamic mask 36 of $SiO_2$ was deposited to a thickness of ~0.1 $\mu$m by plasma-enhanced vapor deposition at 150° C.

A standard mask 38 was then applied by uniformly coating with AZ-5206 photoresist, photographically defining the photoresist, and removing the photoresist in the areas to be deeply etched. That is, the end near the low rib 30 was covered by the standard mask 38. At the other end, the upper part 34 of the high rib 28 and adjacent areas were uncovered. In between, as shown in FIG. 5, the standard mask 38 extended only part way to the left, laterally defining the bottom of the intended slope.

Figure 7:
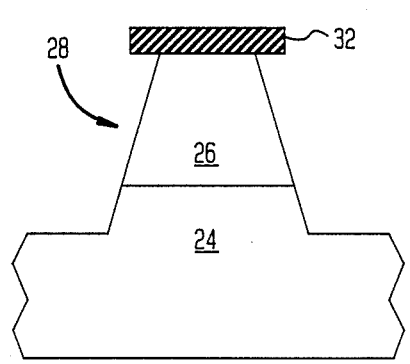
Figure 8:
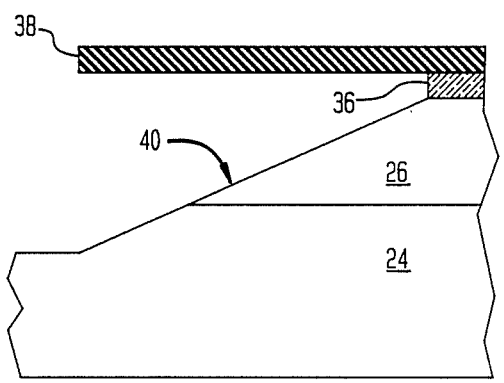

As shown in FIGS. 7 and 8, the structure was then deeply etched with a solution of buffered HF:HBr:SBW (2:1:1) by volume. The buffered HF solution was Buffered Oxide Etch, available from the J. T. Baker Chemical Co., diluted 6:1 with water. In this solution the buffered HF preferentially etches the $SiO_2$ dynamic mask while the HBr:SBW preferentially etches the AlGaAs substrate. The angle of the desired slope can be varied by varying the relative concentrations. A solution of $HCl:H_2O_2:H_2O$ has also been used for etching the AlGaAs and was mixed with buffered HF. On the deeply etched end (FIG. 7), the high rib 28 was formed by the etching extending through the cladding layer 26 into the guiding layer 24. The width of the high rib 28 was reduced by undercutting of the rib mask 32. The structure on the end of the low rib 30 was completely covered by the standard mask 38 and remained unchanged from FIG. 6. In the taper region shown in FIG. 8, the dynamic mask 36 was gradually etched away, dynamically exposing the underlying layers 24 and 26 for etching. Thereby, a tapered region or slope 40 was formed. The rib in the taper region remained covered by the rib mask 32 but was progressively undercut so as to provide lateral tapering as well. Further lateral taper could have been obtained by varying the photolithographic patterning.

Thereafter, the standard mask 38 was removed with acetone, the $SiO_2$ dynamic mask 36 was removed with buffered HF, and the rib mask 32 was removed with acetone.

The taper region, that is, the slope 40, was observed to extend over an axial length of 50 $\mu$m. Since the shallow and deep etches differed by 0.8 $\mu$m, the slope 40 was inclined at approximately 0.9°. In other experiments, slopes of as little as 0.2° have been achieved.

The waveguide structure of FIG. 3 was optically characterized. Separate shallow etched waveguides and deep etched waveguides had been formed on the same substrate to provide calibration data. These were measured to have a propagation loss of 0.2 dB/cm for the shallow etched ones and 1.1 dB/cm for the deep etched ones. The relatively high loss in the deep etched waveguides, believed to be caused by roughness of the rib mask, could perhaps be improved by lower temperature processing. The loss in the combination waveguide of FIG. 3 was also measured. Excess loss attributable to the taper region was less than 0.2 dB. That is, the tapered transition was highly adiabatic.

Figure 9:
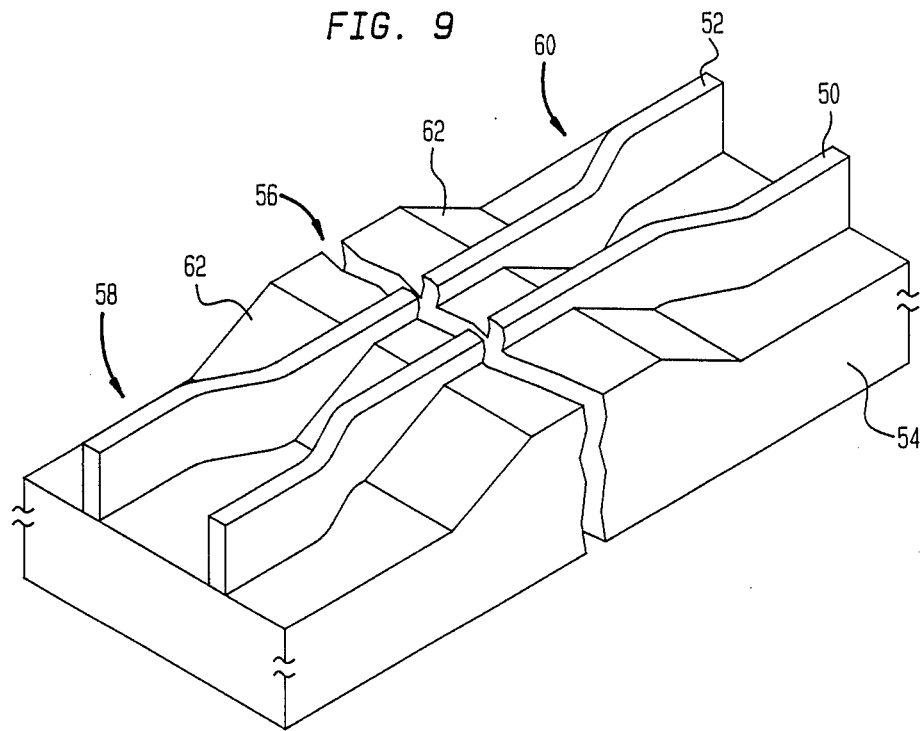
FIG. 9 is a perspective view of a directional coupler built according to the invention.

The tapered waveguide shown in FIG. 3 can be incorporated as a part of a directional coupler, illustrated in perspective in FIG. 9, fabricated according to the invention. The directional coupler has two optical rib waveguides 50 and 52 formed over a substrate 54. The waveguides 50 and 52 are brought close together in an interaction region 56 so as to couple the two waveguides. The low rib 30 of FIG. 6 only poorly confines the light so that light leaks out and is coupled to the neighboring waveguide rib in the interaction region 56. The present invention allows the ribs in the interaction region 56 to be adiabatically coupled to the same ribs in propagation regions 58 and 60 by providing slopes 62 between the regions.

A 3-dB coupler was fabricated. The photomasks were originally designed without regards to tapering so that the two 50 $\mu$m slopes 62 were included within the originally conceived 732 μm coupling region. With the tapering, the interaction length had changed. The ribs and slopes were fabricated according to the embodiment of FIGS. 3 through 8 with the following exceptions. The low ribs had a height of 0.3 μm and a width of 2.5 μm. The high ribs had a height of 1.5 μm and a width of 2.0 μm. The low ribs in the interaction region 56 were separated by a gap of 2.6 μm while the high ribs in the propagation regions 58 and 60 were much further apart.

The fabricated 3 dB coupler was optically tested. The propagation losses in the deep etched and the shallow etched waveguides were the same as those measured for FIG. 3. If even shallower etching were used, the coupling efficiency would be increased, allowing use of shorter coupling lengths. The power division ratio of the tapered directional coupled was measured to be 3.1 dB.

The directional independence of the taper fabrication process was tested in the following way. On top of an unstructured GaAs wafer, there were deposited a dynamic mask of a 2.4 μm thick film of $SiO_2$. A 0.12 μm film of $SiN_x$ on top of the $SiO_2$ improved photoresist adhesion. The standard mask was AZ-1516 photoresist deposited on the $SiN_x$ and photographically defined with rectangular openings. The dynamic mask and the GaAs were etched with a buffered $HF:HCl:H_2O_2:H_2O$ solution (80:20:4:1 by volume). Etching continued to a depth of 1.3 μm while the openings were 100×120 μm. Photomicrographs showed that there was produced a taper length of 38 μm for a slope angle of 2°. The taper length and thus the slope were the same for the (011) and (01$\bar{1}$) directions of the GaAs. This experiment showed that the taper can be done over wide regions and that there is no appreciable problem with the cantilevered standard mask collapsing into the vacancy formed by the etching of the dynamic mask.

Figure 10:
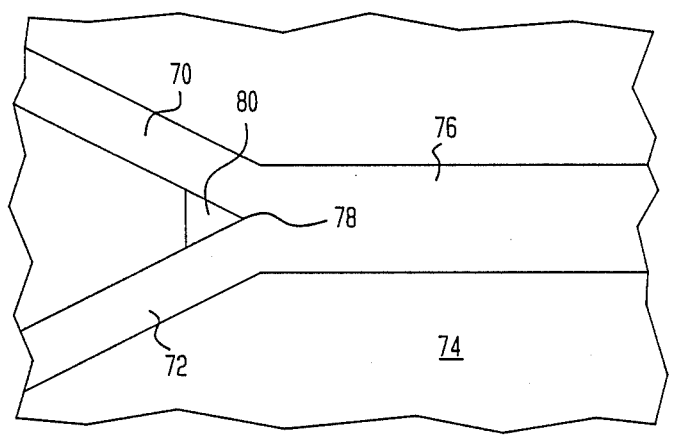
FIG. 10 is a plan view of another directional coupler built according to the invention.

Another application of the invention to rib waveguides is the zero-gap directional coupler shown in FIG. 10. Single-mode rib waveguides 70 and 72 are formed above a substrate 74. They will be referred to as input waveguides although identical structure is required for the output waveguides on the right. One desired way of coupling their signals, particularly if the rib waveguides 70 and 72 are very deep, is to connect them both to a coupling rib waveguide 76 that can support two modes. That is, the coupling waveguide 76 is approximately 150% as wide as the input waveguides 70 and 72. The two input modes will experience different phase shifts in the coupling waveguide 76. A problem, however, with the so far described structure for FIG. 10 is the mode mismatch between either of the input waveguides 70 and 72 and the coupling waveguide 76 caused by the sharp transition in waveguide widths which any mode experiences at a tip 78 between the rib waveguides 70, 72 and 76. Due to the etching of the deep ribs, the tip 78 is truncated, causing modal mismatch.

A solution to this problem is to taper a transition region 80 by use of a dynamic mask. A dynamic mask is first deposited over the area of the intended transition region 80. The standard rib mask is deposited over the intended areas of the rib waveguides and over the dynamic mask overlying the transition region 80. The concentration of the etchant is chosen so that the dynamic mask is consumed at about the same time that the ribs 70, 72 and 76 are vertically defined. Thereby, a slope is formed across the transition region 80, providing a gradual transition between the input waveguides 70 and 72 the coupling waveguide 76.

The process described above must be carefully done to ensure that the tip 78 is aligned in the middle of the coupling waveguide 78. If they are not aligned, there is again mode mismatch. One self-aligning procedure between the dynamic and standard masks is performed as follows. First, the dynamic mask, assumed to be $SiO_2$, is uniformly coated on the semiconductor substrate in the area of the coupler. A dark-field photoresist mask is deposited and defined for the waveguides 70, 72 and 76. A dark-field mask has openings therein for defining the waveguides. This dark-field mask ignores the transition region 80 so that it conforms to the shape of the tip 78. The dark-field masked wafer is then etched with the dynamic mask etchant (buffered HF for $SiO_2$) so as to remove the dynamic mask material in the dark-field mask grooves, that is, in the area of the waveguides 70, 72 and 76. The dynamic mask etchant does not etch the underlying semiconductor. After the dark-field mask is removed, another layer of photoresist is uniformly coated over the dynamic mask material so as to fill the grooves formed in the dynamic mask material overlying the eventual waveguides 70, 72 and 76. A clear-field mask is formed from the second photoresist generally over the areas of the transition region 80 and the waveguides 70, 72 and 76. However, the width of the clear-field mask is wider than the previously defined grooves so as to absorb any alignment error. That is, the clear-field mask not only fills the grooves in the dynamic mask material but also extends a short distance over the dynamic mask. Additionally the clear-field mask covers the transition region 80. The wafer is then etched in the dynamic mask etchant which removes not only the exposed dynamic mask material but also side etches the dynamic mask material at the sides of the areas of the waveguides 70, 72 and 76. That is, the side etching through the alignment buffer area continues until the photoresist in the grooves is encountered. However, the side etching is not continued for long enough to destroy the dynamic mask overlying the transition region 80. The mask structure remaining is the dynamic mask over the transition region 80 and the standard photoresist mask over the dynamic mask and the areas of the waveguides 70, 72 and 76. Thereafter, the combination etchant of buffered HF and SBW is applied to etch into the semiconductor and to form the slope in the transition region 80.

Although the above invention has been described with reference to semiconductor rib waveguides, the invention is not so limited. Other opto-electronic devices have similar requirements for gradually sloped surfaces. Indeed, the invention is not even limited to semiconductor devices but may be practiced on other substrate materials.

What is claimed is:

1. A method of forming a sloping surface, comprising the steps of
depositing on a principle surface of a substrate material a first layer of a first material of a first composition;
depositing on an outer surface of said first layer a second layer of a second material of a second composition;
patterning said second layer so as to expose a portion of said first layer; and
applying an etching medium to said principle surface deposited with said first layer and with said patterned second layer for etching said substrate material and said first layer, said etching medium having a first etching rate for said substrate material and a second etching rate for said first material greater than said first etching rate, said etching medium etching said second material, if at all, at an etching rate less than said first etching rate.

2. A method as recited in claim 1, wherein said etching medium is a liquid mixture of a first etching liquid and a second etching liquid, said first etching liquid having a higher etching rate for said substrate material than for said first material, said second etching liquid having a higher etching rate for said first material than for said substrate material, said method further comprising the step of selecting a proportion of said first and second etching liquids in said mixture in accordance with a desired slope in said substrate material.

3. A method as recited in claim 1, further comprising patterning said first layer so as to form an aperture therethrough and wherein said step of depositing said second layer includes depositing said second material in said aperture.

4. A method as recited in claim 3, further comprising, after said step of patterning of said second layer and prior to said step of applying said etching medium, applying a second etching medium to said principle surface for a period of time sufficient to etch through a portion of said first layer so as to expose a portion of said second layer exposed at a sidewall of said aperture.

5. A method as recited in claim 1, wherein said first etching rate is an etching rate in a direction perpendicular to said principle surface and said second etching rate is an etching rate in a direction parallel to said principle surface.

6. A method of forming a sloping surface in a semiconductor material, comprising the steps of
depositing on a principle surface of the semiconductor material a first layer of a first material of a first composition;
depositing on an outer surface of said first layer a second layer of a second material of a second composition;
patterning said second layer so as to expose a portion of said first layer; and
applying an etching medium to said principle surface deposited with said first layer and with said patterned second layer for etching said semiconductor material and said first layer, said etching medium having a first etching rate for said semiconductor material and a second etching rate for said first material greater than said first etching rate, said etching medium etching said second material, if at all, at an etching rate less than said first etching rate.

7. A method as recited in claim 6, wherein said patterning step comprises etching an aperture through said second layer and exposing an outer surface of said first layer.

8. A method as recited in claim 6, wherein said second material comprises a photoresist and wherein said patterning step comprises exposing said photoresist to a pattern of radiant energy.

9. A method as recited in claim 8, wherein said first material comprises an inorganic material.

10. A method as recited in claim 9, wherein said inorganic material comprises silicon oxide and said etching medium comprises a mixture of buffered HF and an etching solution that etches said semiconductor material.

11. A method as recited in claim 6, wherein said etching medium is a liquid mixture of a first etching liquid and a second etching liquid, said first etching liquid having a higher etching rate for said semiconductor material than for said first material, said second etching liquid having a higher etching rate for said first material than for said semiconductor material, said method further comprising the step of selecting a proportion of said first and second etching liquids in said mixture in accordance with a desired slope in said semiconductor material.

12. A method as recited in claim 6, wherein said second etching rate is at least 22 times as great as said first etching rate.

13. A method as recited in claim 6, further comprising:
prior to said step of depositing said first layer, depositing on said principle surface of said semiconductor material a third layer of a third material;
patterning said third layer to define a rib therebeneath in said semiconductor material; and
etching portions of said semiconductor material exposed by said third layer to a first depth;
wherein said first layer is deposited over said third layer and said etched portions of said semiconductor material;
wherein said patterning of said second layer removes a portion of said second layer extending on partial lateral sides of said rib; and
wherein said step of applying an etching medium etches said semiconductor material to a second depth greater than said first depth.

14. A method as recited in claim 6, further comprising patterning said first layer so as to form an aperture therethrough and wherein said step of depositing said second layer includes depositing said second material in said aperture.

15. A method as recited in claim 14, further comprising, after said step of patterning of said second layer and prior to said step of applying said etching medium, applying a second etching medium to said principle surface for a period of time sufficient to etch through a portion of said first layer so as to expose a portion of said second layer exposed at a sidewall of said aperture.

* * * * *

UNITED STATES PATENT AND TRADEMARK OFFICE
CERTIFICATE OF CORRECTION

PATENT NO. : 4,938,841

DATED : July 3, 1990

INVENTOR(S) : Arie Shahar and Walter J. Tomlinson, III

It is certified that error appears in the above-identified patent and that said Letters Patent is hereby corrected as shown below:

Column 3, line 17, "1989, U.S. Pat. No. 4,922,508" should read
--1989, now issued as U.S. Patent 4,922,500--.

Signed and Sealed this

Eleventh Day of February, 1992

*Attest:*

HARRY F. MANBECK, JR.

*Attesting Officer*      *Commissioner of Patents and Trademarks*